United States Patent [19]
Jäger

[11] Patent Number: 6,087,829
[45] Date of Patent: Jul. 11, 2000

[54] METHOD FOR MEASURING THE ROTATION ANGLE OF A ROTATABLE SHAFT, ESPECIALLY A ROTATABLE SWITCH, AND DEVICE FOR WORKING THE METHOD

[75] Inventor: Wolfgang Jäger, Schlüchtern, Germany

[73] Assignee: Mannesmann VDO AG, Frankfurt, Germany

[21] Appl. No.: 09/074,336

[22] Filed: May 7, 1998

[30] Foreign Application Priority Data

May 9, 1997 [DE] Germany .......................... 197 19 564

[51] Int. Cl.⁷ ..................................................... G01B 7/30
[52] U.S. Cl. ................ 324/207.25; 324/207.12; 324/207.2
[58] Field of Search .......... 324/207.25, 207.12, 324/207.2, 233, 32 H, 32 R; 702/85, 88, 151, 158, 145, 146, 147, 148

[56] References Cited

U.S. PATENT DOCUMENTS

| | | | |
|---|---|---|---|
| 5,811,968 | 9/1998 | Nakazawa et al. | 324/207.2 |
| 5,889,400 | 3/1999 | Nakazawa | 324/207.2 |

*Primary Examiner*—Christine Oda
*Assistant Examiner*—Anthony Jolly
*Attorney, Agent, or Firm*—Martin A. Farber

[57] ABSTRACT

In a method for detecting the rotational angle ($\alpha$) of a rotatable shaft, in which two sinusoidal signals are generated by rotation of the shaft, the signals having a phase shift of 90° with respect to one another, and being standardized, and in which the signal values of the two signals are measured at the desired rotational angle ($\alpha$), the following provisions are made:

a) the signal values that are larger than the standardized maximum value or smaller than the standardized minimum value are limited to the maximum or minimum values;

b) from the value of the measured signals, the quadrant is determined in which the desired angle ($\alpha$) is located;

c) depending on the sign of the respective curve slope, the sign of the signal value is changed or retained;

d) the adapted signal values thus obtained are added to produce a first sum (S);

e) the following equation is valid for the angle difference ($\beta$) between the middle of the determined quadrant and the desired angle ($\alpha$):

$$\beta = \frac{S}{AD} \times 90°$$

where AD is the value of the amplitude difference between the standardized maximum and minimum amplitudes.

14 Claims, 5 Drawing Sheets

6,087,829

METHOD FOR MEASURING THE ROTATION ANGLE OF A ROTATABLE SHAFT, ESPECIALLY A ROTATABLE SWITCH, AND DEVICE FOR WORKING THE METHOD

FIELD AND BACKGROUND OF THE INVENTION

The invention relates to a device for measuring the rotational angle of a rotatable shaft, in which two sinusoidal signals, phase-shifted with respect to one another, are produced and the rotational angle is determined from the measured values of the signals, with the sinusoidal signals being standardized prior to the first measurement, and a device for working the method.

With such a device, the sinusoidal signals are subject to fluctuations in amplitude which are caused for example by aging or by responses to temperature changes of the parts used. For this reason, in known methods that use the measured values for arc sine and arc cosine functions to determine the measured rotational angle, the standardization is also repeated during the ongoing measurements. This is achieved for example by measuring an extreme value for one signal when it is determined that the other signal is passing through zero. The arc sine and arc cosine functions and the additional standardizations each require costly, complex, and hence time-consuming calculations.

SUMMARY OF THE INVENTION

The goal of the invention is to provide a method and a device for working the method that require only simple calculations. This goal is achieved by virtue of the fact that the signals that are larger than the standardized maximum value or smaller than the standardized minimum value are limited to the maximum and minimum values. In addition, the quadrant in which the desired angle is located is determined from the value of the two measured signals. As a function of the sign of the respective curve slope, the sine of the measured signal value is changed or retained. Thus, either the sign of the corresponding signal value can be retained with a positive slope of the respective curve and the sign of the signal value can be changed with a negative slope of the respective curve (first alternative), or the sign of the respective signal value can be changed with a positive slope of the respective curve and the sign of the signal value can be retained with a negative slope of the respective curve (second alternative). The signal values thus obtained are added together to obtain a first sum S. This first sum S corresponds to the difference in angle β between the middle of the quadrant determined and the measured angle, with the value of the amplitude difference AD between the standardized maximum and minimum amplitudes corresponding to an angle of 90°, so that:

$$\beta = \frac{S}{AD} \times 90° \quad \text{(equation 1)}$$

This method has the advantage that it is not necessary to perform any standardization during the measurements.

If we add to the first sum S thus obtained, half of the value of the amplitude difference AD between the standardized maximum and minimum amplitudes, a second sum is obtained. This second sum provides the value of the measured rotational angle for a complete revolution of 90° within the specified quadrant, with the value of a complete rotation through 90° likewise corresponding to the value of the amplitude difference between the standardized maximum and minimum amplitudes.

The difference angle β can also be read graphically on a third curve. If the sign of the measured value was changed during a negative slope of the respective sinusoidal curve, the third curve, at the beginning of each quadrant, has half the negative value of the amplitude difference between the standardized maximum and minimum amplitudes. In the middle of the quadrant it has the value 0, and at the end of the same quadrant it has half the positive value of the amplitude difference between the standardized maximum and minimum amplitudes. If the curve is a straight line within a quadrant, the values that are read correspond to the value obtained according to Equation 1. The third curve is more complicated but more exact when, for a number of angles, the sums of the sine and cosine values corresponding to the respective angles are assigned, whose sign was changed during a falling signal curve. It is disadvantageous in this connection however that the function values must be recalculated or stored in a memory and must then be compared with the first sum obtained from the measured values. The system-related error that occurs when Equation 1 is used is less than 1% of a complete revolution and is acceptable in most applications if the amplitudes do not exceed or fall below the standardized amplitude by certain values.

Instead of a third curve, one can also use an angle table, with the sums of the respective sine and cosine values of the angles being assigned to the corresponding angles, with the signs of the respective values being adapted in accordance with step c).

In each quadrant, the sums assume values between −1 and +1, and a certain angle value can be assigned to each value within a quadrant. If a measured value falls between two values in the table, the measured value can be determined accordingly.

A fourth curve that extends from zero up to four times the value of the amplitude difference AD between the standardized maximum and minimum amplitudes assigns a certain value to each angle within the four quadrants, so that with the value determined, the angle can be read off in the fourth curve. For this purpose, a number of values of amplitude difference AD must be added to the calculated first sum of the two measured values in each quadrant that are required to shift the third curve from its position between the negative half value of amplitude difference AD and the half value of amplitude difference AD in each quadrant, to the corresponding position in the respective quadrant.

With a skillful subdivision of standardization, one obtains, by addition of the sums of the two measured values and the correction value for the respective quadrants, by simple addition or subtraction, the desired angle in a certain ratio to a complete revolution. By subdividing the amplitude difference between the maximum and minimum standardized amplitudes into 90 equal parts, the first sum gives the distance of the desired angle in degrees from the middle of the quadrant determined.

A device according to the invention for working the method has a generator that generates a sinusoidal signal by rotation and which is connected with the shaft whose rotational angle is to be determined. Such a construction is especially advantageous for a rotatable switch. The device also has two sensors located at equal distances from the rotational axis of the shaft so that they can detect the signal emitted by the generator, with the sensors being located so that the signals they receive are shifted in phase by 90°. Finally the device has an evaluation unit that calculates the angle from the signals received, using the method according to the invention. The generator that generates a sinusoidal signal advantageously consists of a magnet rotatably mounted around its central perpendicular axis. The sensors are then advantageously made as Hall sensors or coils. An especially simple circuit design can be obtained by using self-adjusting Hall sensors.

BRIEF DESCRIPTION OF THE DRAWINGS

With the above and other objects and advantages in view, the present invention will become more clearly understood in connection with the detailed description of preferred embodiments, when considered with the accompanying drawings, of which.

DETAILED DESCRIPTION OF THE PREFERRED EMBODIMENTS

Figure 1:
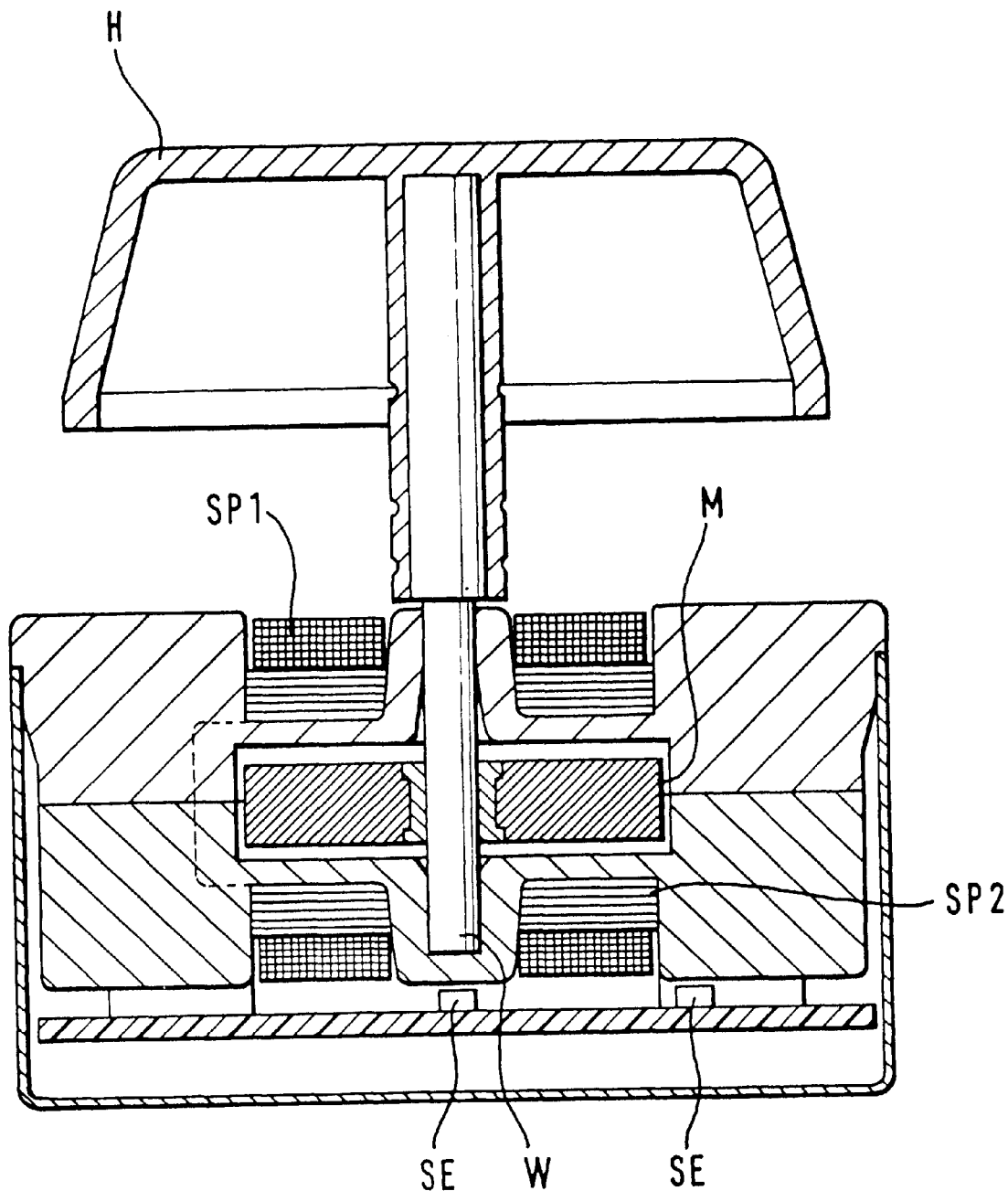
FIG. 1 is a section through a rotatable switch in which the method according to the invention can be used to determine the rotational angle.

FIG. 1 shows a rotatable switch in which a shaft W with a diametrically magnetized disk M is mounted so that it can be rotated by a handle H. The diametrically magnetized disk M produces voltages in Hall sensors SE from whose values the rotational angle of shaft W can be calculated by the method according to the invention.

Two coils SP1, SP2 are arranged so that when they are energized, they generate a torque in cooperation with the diametrically magnetized disk M that an operator of the switch can feel through the handle H.

Figure 2:
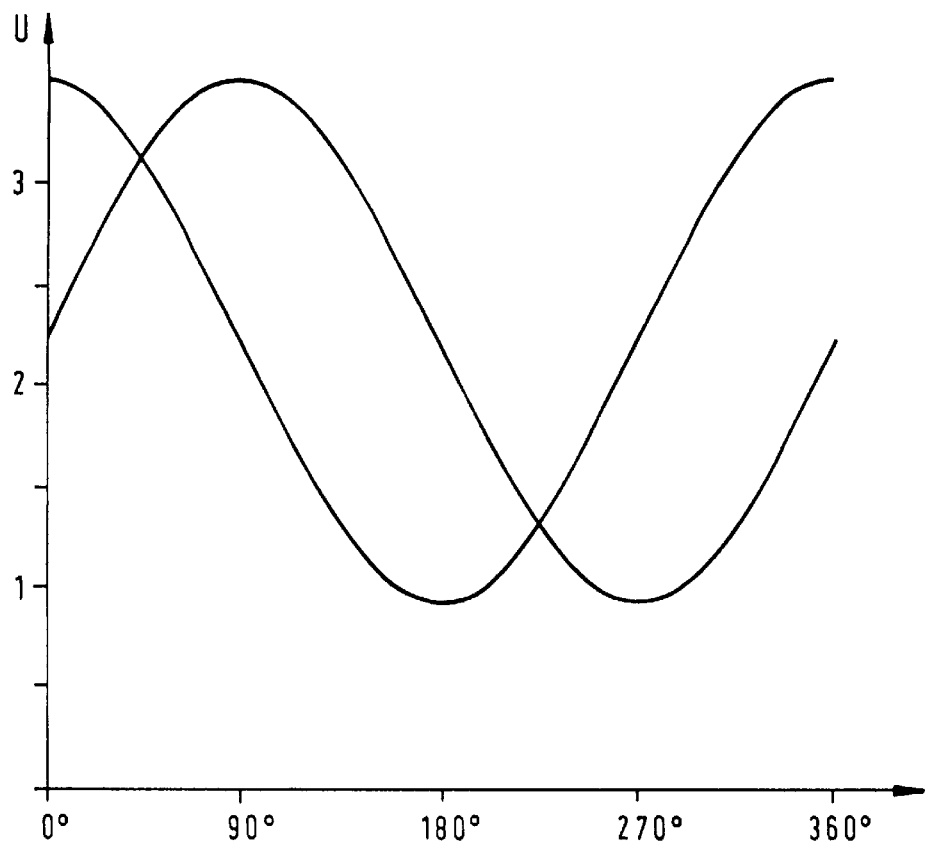
FIG. 2 shows the curve of two phase-shifted signals.

FIG. 2 shows the voltages that two Hall sensors for example provide during a rotation of a diametrically magnetized disk through 360°, said disk being connected with the shaft whose rotational angle is to be determined. These voltages are amplified and provided with an offset. This is advantageously accomplished in the Hall sensors that are available today. The Hall sensors advantageously have a compensating circuit to minimize the fluctuations in offset voltage OF. The signals are advantageously digitized with an A/D converter and processed in an evaluation unit that can consist of a microcontroller or microprocessor.

Advantageously, the minimum amplitude of the signals for sine 90° or cosine 0° are used as the amplitude of the standardized voltage. The advantages thus gained will be explained in greater detail below, especially with reference to FIG. 8.

Figure 3:
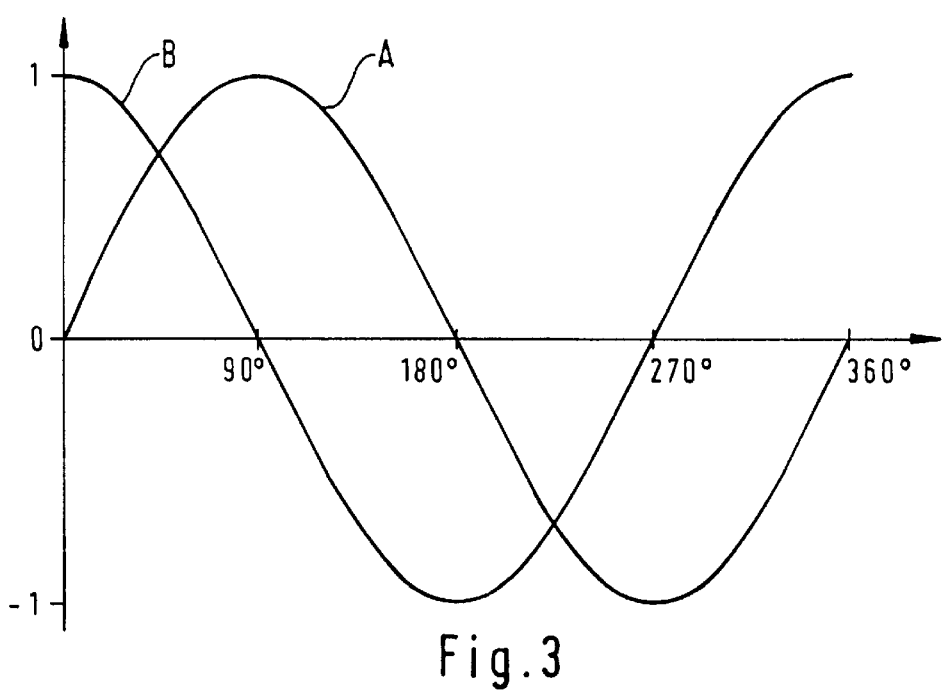
FIG. 3 shows the curve of the two signals in FIG. 2 after their standardization.

Advantageously, a curve as shown in FIG. 3 is chosen in which the average value of the signals is equal to zero. In FIG. 3 the maximum value of the amplitude of the signals= plus 1. The minimum value of the amplitude corresponds to minus 1. Thus there is an amplitude difference AD of 2 between the values of the standardized maximum and minimum amplitudes.

Figure 4:
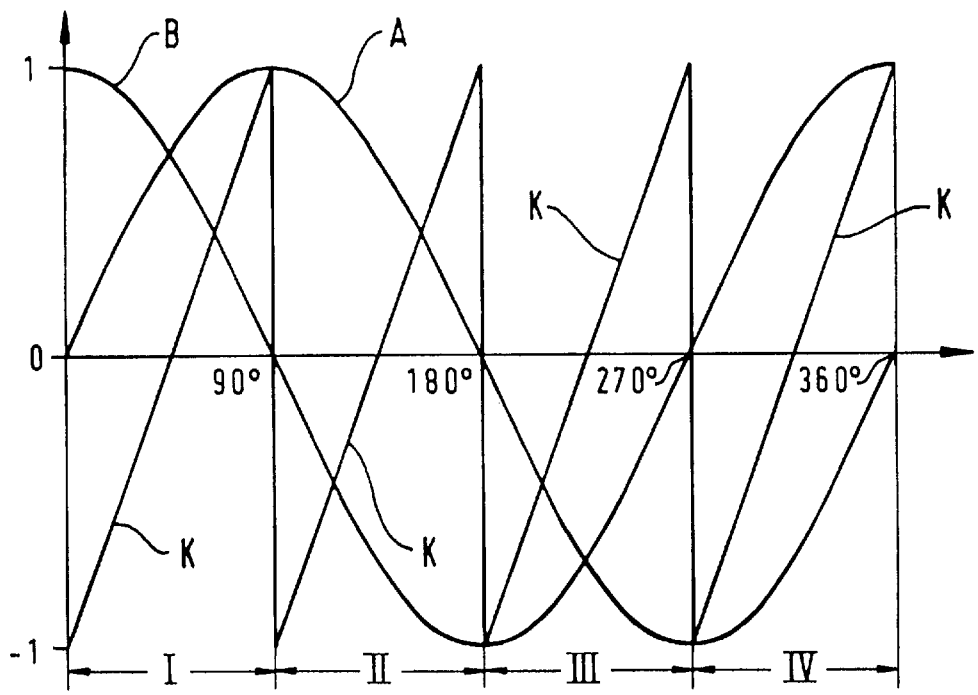
FIG. 4 shows the standardized signals in FIG. 3 and a third curve.

FIG. 4 shows the changes in sign of the values WA and WB of sine curve A and cosine curve B in the four quadrants I to IV. Sine curve A, in the second and third quadrants II and III, has a negative slope. For this reason, the sign of a measured function value WA is changed in these quadrants. Cosine curve B has a negative slope in the first and second quadrants I and II, so that a sign of a measured functional value WB is changed in the first and second quadrants I and II. In general, for the function values WA, WB, the following changed function values WAV, WBV are valid:
In the first quadrant: WAV=+WA WBV=−WB
In the second quadrant: WAV=−WA WBV=−WB
In the third quadrant: WAV=−WA WBV=+WB
In the fourth quadrant: WAV=+WA WBV=+WB The first sum is formed from the sums of the adapted function values WAV, WBV of the respective function values WA, WB that are measured at an angle α to be determined. The first sum corresponds to the angle difference β between the middle of the respective quadrants (45°, 135°, 225°, 315°) and the measured angle α, with the value of the amplitude difference AD between the standardized maximum amplitude (+1) and the standardized minimum amplitude (−1) corresponding to a value of 90°. Therefore, the following equation applies to the values from the examples in FIG. 3

$$\beta = \frac{S2 \times 90°}{AD} = \frac{\left(S + \frac{1}{2}AD\right) \times 90°}{AD} = S \times 45°$$

In order to obtain the desired angle α, the angle δ that is between 0° and the middle of the quadrant in which the desired angle α is located, must be added to angle β.

In FIG. 4, the third curve K is also shown. Curve K begins at −1 at the start of each quadrant, has the value 0 in the middle of the respective quadrant, and rises to a value of 1 at the end of the respective quadrant. The third curve K is either a distance between the beginning and end of a quadrant or it is obtained by the sum of the respective sine and cosine values of the corresponding angles, with the sign of the respective function value WA, WB being changed when the respective function has a negative slope.

Figure 5:
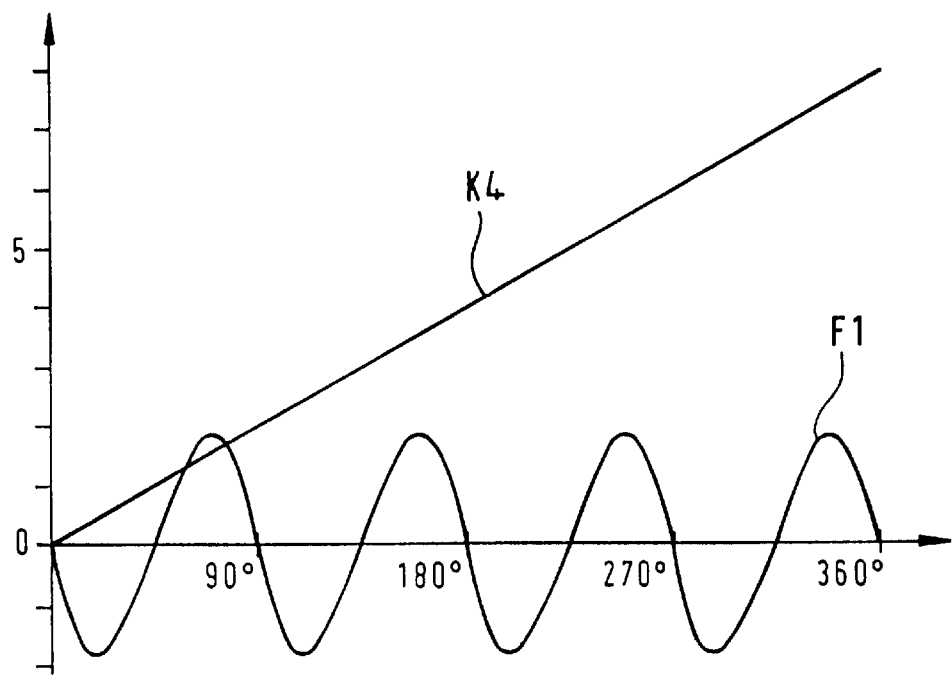
FIG. 5 shows the curve of a fourth curve and the curve of the system error obtained from Equation 1.

If the third curve K in each quadrant is provided with a certain given offset, the fourth curve K4 shown in FIG. 5 is obtained, which extends from 0 at the beginning of the first quadrant to 8 (the four-fold value of the amplitude difference AD between the standardized maximum (plus 1) and minimum (minus 1) amplitude). FIG. 5 also shows the error F1 in degrees that results from the fact that Equation 1 is used to determine the desired angle α instead of reading the angle from a third curve K obtained by addition of the sine and cosine values corresponding to the angles, whose signs have been appropriately adapted. Thus, when Equation 1 is used, a systemic error F1 of up to +/−2° relative to the actual angle occurs when the measured sine and cosine curves correspond to the standardized values.

Figure 6:
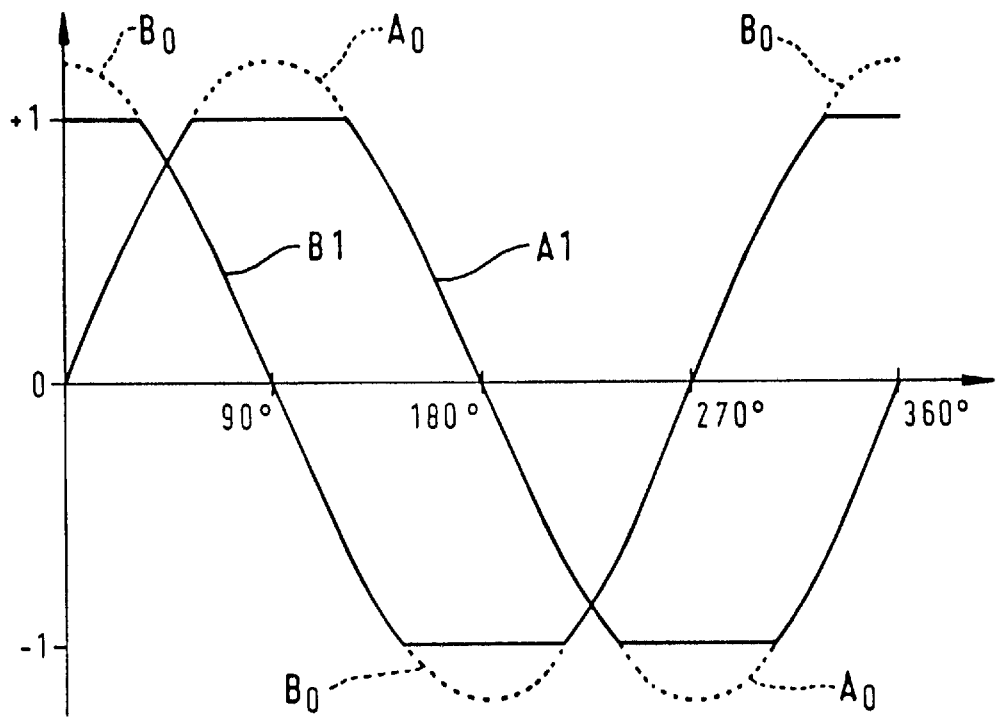
FIG. 6 shows the standardized curve according to the invention for signals whose maximum amplitude corresponds to 1.2 times the standardized amplitude.

FIG. 6 shows the curves of two sinusoidal signals A1, B1 following standardization, whose amplitude before the delimitation had 1.2 times the value of the standardized signal as indicated by the dotted part of the curve $A_0$, $B_0$.

Figure 7:
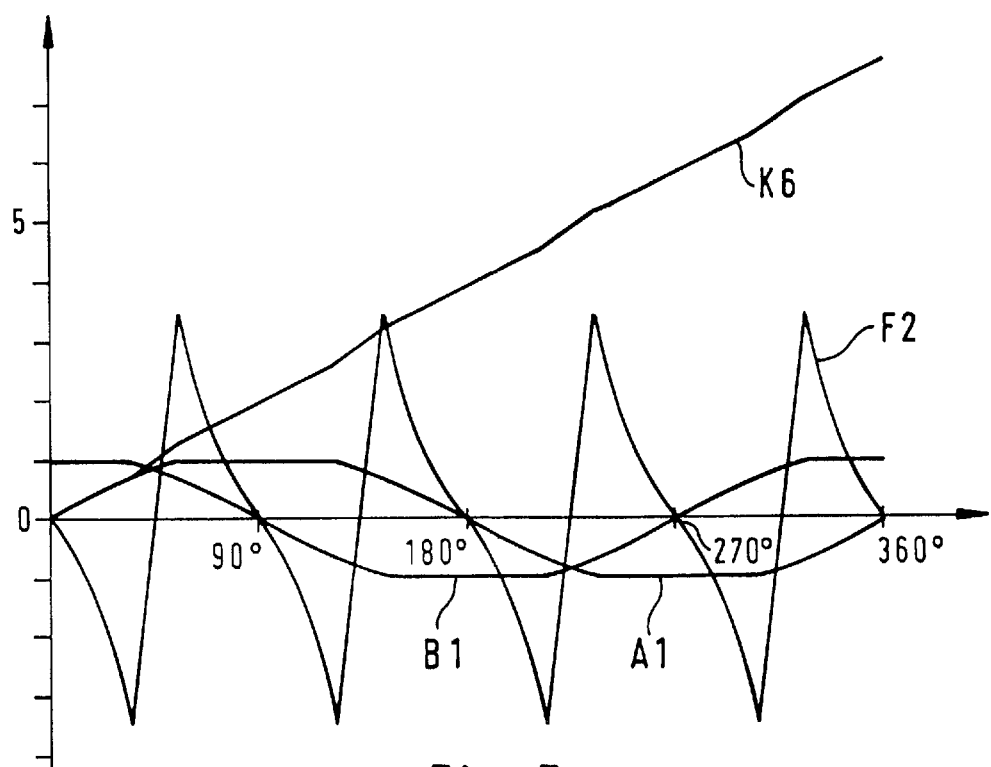
FIG. 7 shows the curve in FIG. 8, the fourth curve in FIG. 5, and the error that results from the fact that the peaks of the curve in FIG. 6 have been cut off.

FIG. 7 shows the two signals A1, B1 from FIG. 6 and curve K6 obtained by virtue of the fact that curves A1, B1 are added with adapted sign and provided in each quadrant with an offset such that the curve is constant. The offset has the following values:
In the first quadrant +0.5 AD
In the second quadrant +1.5 AD
In the third quadrant +2.5 AD
In the fourth quadrant +3.5 AD
The overall error that occurs as a result of using Equation 1 in degrees F2 is likewise shown.

It is evident that it is equal to 0 at 45°, 90°, . . . and rises up to 1° in between. It is important that no jumps occur in the errors, so that with small angle changes, the measured angular difference is subject to only a small error.

Figure 8:
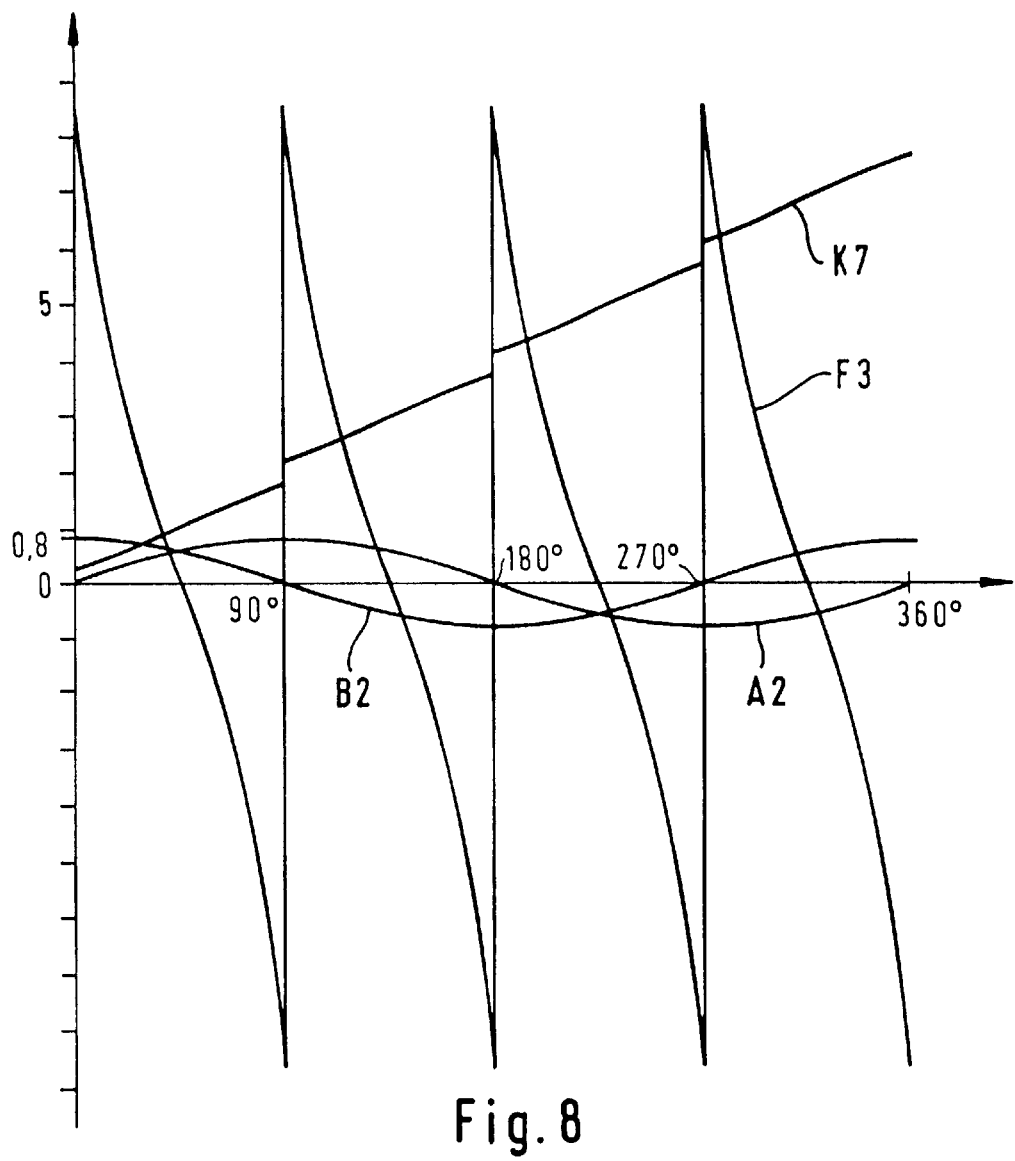
FIG. 8 shows two curves that reach only 0.8 times the standardized amplitude and the error that occurs as a result of the method according to the invention, when Equation 1 is used.

If the measured signals become smaller than the standardized signals, as for example in FIG. 8, where the amplitudes of the measured signals A2, B2 have only 0.8 times the value of the standardized signal, the addition of the two curves A, B with correspondingly adapted signs and an offset as in curve K6 in FIG. 7, produces curve K7.

Jumps can be seen. This means in the case of error F3 that develops that it makes a jump each time at a multiple of 90° and changes its sign as it does so. Thus, with a small angle change in the shaft, for example at 89.5° to 90.5°, an angle change of 4° can be calculated, and the measurement result cannot be used for small angle changes. For this reason, it is advantageous to select the standardized value so that no smaller amplitude difference than the amplitude difference AD between the standardized maximum and minimum values can occur in order to be able to use the method for small angle changes to be measured.

Figure 9:
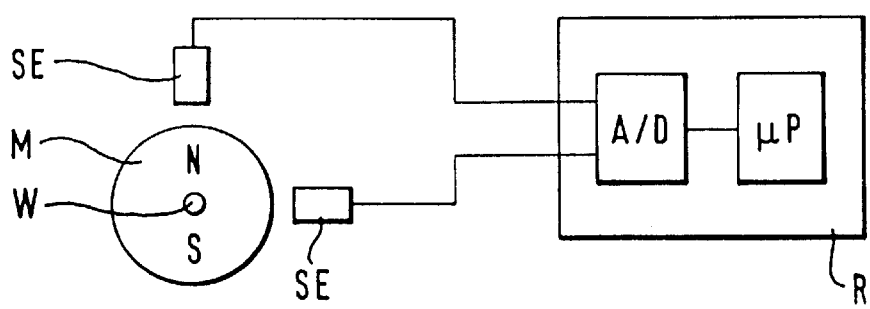
FIG. 9 shows the diagram of a device according to the invention for working the method according to the invention.

FIG. 9 shows a diametrically magnetized disk M connected with rotational shaft W. Two sensors SE are arranged offset at equal radial distances from rotational shaft W and disk M by 90°. Upon rotation, sinusoidal signals appear that are phase-shifted by 90° between the Hall sensors SE. These values are evaluated in the evaluation unit R using the method described above, with the evaluation unit R having an A/D converter and a microprocessor $\mu P$.

I claim:

1. Method for detecting a desired rotational angle ($\alpha$) of a rotatable shaft, comprising steps of:
   upon rotation of the shaft, producing two sinusoidal signals (A, B) that have a phase shift of 90° with respect to one another;
   standardizing of the signals (A, B) before a first measurement;
   measuring signal values (WA, WB) of the two signals (A, B) at the desired rotational angle ($\alpha$) to provide values of measured signals;
   wherein the method further comprises steps of:
   a) setting the signal values (WA, WB) that are larger than a standardized maximum value or smaller than a standardized minimum value to be limited to the maximum and minimum values, a difference between amplitudes of the standardized maximum and standardized minimum values being identified as AD;
   b) from the value of the measured signals, determining a quadrant (I, II, III, IV) in which the desired angle ($\alpha$) is located;
   c) establishing a sign of a value of the signal values (WA, WB), wherein as a function of a sign of a respective curve slope, the sign of the signal value (WA, WB) is changed or retained;
   d) obtaining adapted signal values (WAV, WBV), and adding the adapted signal values (WAV, WBV) to produce a first sum (S); and ei) for an angle difference ($\beta$) between the middle of a determined quadrant (I, II, III, IV) and the desired angle ($\alpha$), applying the following equation:

$$\beta = \frac{S}{AD} \times 90°.$$

2. Method according to claim 1, wherein in said establishing step (c), with a negative curve slope, the sign of the respective signal value (WA, WB) is adapted, and wherein a half value of amplitude difference (AD) is added to the first sum (S) to produce a second sum (S2); and
   the method further comprises, for angle difference ($\gamma$) between the beginning of the quadrants determined (I, II, III, IV) and the desired angle ($\alpha$), applying the following equation:

$$\gamma = \frac{\left(S + \frac{1}{2}AD\right) \times 90°}{AD} = \frac{S2 \times 90°}{AD} = \beta \times 45°.$$

3. Method according to claim 2, further comprising a step of forming a third sum (S3) from the second sum (S2) and the product of an n-multiple of the amplitude difference (AD) between the standardized maximum and minimum values, where n in the first quadrant (I) has a value of 0, in the second quadrant (II) has a value of 1, in the third quadrant (III) has a value of 2, and in the fourth quadrant (IV) has a value of 3; and
   applying the following equation for the desired angle ($\alpha$):

$$\alpha = \frac{S3}{4 \times AD} \times 90°.$$

4. Method for detecting a desired rotational angle ($\alpha$) of a rotatable shaft, comprising steps of:
   upon rotation of the shaft, producing two sinusoidal signals (A, B) that have a phase shift of 90° with respect to one another;
   standardizing of the signals (A, B) before a first measurement;
   measuring signal values (WA, WB) of the two signals (A, B) at the desired rotational angle ($\alpha$) to provide values of measured signals;
   wherein the method further comprises steps of:
   a) setting the signal values (WA, WB) that are larger than a standardized maximum value or smaller than a standardized minimum value to be limited to the maximum and minimum values, a difference between amplitudes of the standardized maximum and standardized minimum values being identified as AD;
   b) from the value of the measured signals, determining a quadrant (I, II, III, IV) in which the desired angle ($\alpha$) is located;
   c) establishing a sign of a value of the signal values (WA, WB), wherein as a function of a sign of a respective curve slope, the sign of the signal value (WA, WB) is changed or retained;
   d) obtaining adapted signal values (WAV, WBV), and adding the adapted signal values (WAV, WBV) to produce a first sum (S); and
   e2) forming a third curve (K) having a characteristic wherein the third curve (K) shows either a straight line between the minimum standardized value (−1) at the beginning of a quadrant (0°) and the maximum standardized value (+1) at the end of a quadrant, when, in step (c), the sign of the signal value (WA, WB) with a negative slope of the curve has been changed or, between the maximum standardized value (+1) at the beginning of quadrant (0°) and the minimum standardized value (−1) at the end of the quadrant (90°) if, in step (c), the sign of the signal value (WA, WB) was adapted with a positive slope of curve (K);

wherein the desired angle corresponds to an angle that the third curve (K) has in the respective quadrants (I, II, III, IV) for the value of the first sum (S).

5. Method for detecting a desired rotational angle (α) of a rotatable shaft, comprising steps of:

upon rotation of the shaft, producing two sinusoidal signals (A, B) that have a phase shift of 90° with respect to one another;

standardizing of the signals (A, B) before a first measurement;

measuring signal values (WA, WB) of the two signals (A, B) at the desired rotational angle (α) to provide values of measured signals;

wherein the method further comprises steps of:
 a) setting the signal values (WA, WB) that are larger than a standardized maximum value or smaller than a standardized minimum value to be limited to the maximum and minimum values, a difference between amplitudes of the standardized maximum and standardized minimum values being identified as AD;
 b) from the value of the measured signals, determining a quadrant (I, II, III, IV) in which the desired angle (α) is located;
 c) establishing a sign of a value of the signal values (WA, WB), wherein as a function of a sign of a respective curve slope, the sign of the signal value (WA, WB) is changed or retained;
 d) obtaining adapted signal values (WAV, WBV), and adding the adapted signal values (WAV, WBV) to produce a first sum (S); and
 obtaining a third curve (K) wherein for a certain number of given angles the respective (WA, WB) sums of the sine and cosine values corresponding to the angles are assigned, with the sine and cosine values having the signs adapted in step (c);

wherein the desired angle corresponds to an angle that the third curve (K) has in the respective quadrants (I, II, III, IV) for the value of the first sum (S).

6. Method for detecting a desired rotational angle (α) of a rotatable shaft, comprising steps of:

upon rotation of the shaft, producing two sinusoidal signals (A, B) that have a phase shift of 90° with respect to one another;

standardizing of the signals (A, B) before a first measurement;

measuring signal values (WA, WB) of the two signals (A, B) at the desired rotational angle (α) to provide values of measured signals;

wherein the method further comprises steps of:
 a) setting the signal values (WA, WB) that are larger than a standardized maximum value or smaller than a standardized minimum value to be limited to the maximum and minimum values, a difference between amplitudes of the standardized maximum and standardized minimum values being identified as AD;
 b) from the value of the measured signals, determining a quadrant (I, II, III, IV) in which the desired angle (α) is located;
 c) establishing a sign of a value of the signal values (WA, WB), wherein as a function of a sign of a respective curve slope, the sign of the signal value (WA, WB) is changed or retained;
 d) obtaining adapted signal values (WAV, WBV), and adding the adapted signal values (WAV, WBV) to produce a first sum (S); and
 e4) comparing the first sum (S) with an angle table, whereby in the angle table, the respective sums of the sine and cosine values of the angles are assigned to the corresponding angles, with the signs of the sine and cosine values being adapted in accordance with step (c).

7. Method according to claim 4, wherein, in step (c), with a negative curve slope, the sign of signal value (WA, WB) is changed;

the method further comprises shifting the parts of third curve (K) in the individual quadrants (I, II, III, IV) in the Y direction so that they form a constant fourth curve which at the beginning of the first quadrant (I) has the value of 0 and at the end of the fourth quadrant (IV) has a four-fold value of the amplitude difference (AD) between the standardized maximum and minimum amplitudes;

comparing the third sum with the fourth curve (K4, K6); and wherein the desired angle (α) corresponds to the angle that the fourth curve has for the value of the third sum (S3).

8. Method according to claim 1, wherein, in said standardizing step the values of the standardized amplitude are selected so that they are smaller than or the same size as the smallest amplitude that can occur as a result of fluctuations of the amplitudes of the sinusoidal curves (A, B).

9. Device for detecting a desired rotational angle (α) of a rotatable shaft, comprising:

a generator that generates a sinusoidal signal, said generator being connected with the rotatable shaft for which the desired rotational angle (α) is to be determined;

two sensors for measuring signals (A, B), said sensors (SE) being arranged about the shaft spaced apart by 90°;

a computer operative to standardize the signals (A,B) before a first measurement of the desired angle; and and an evaluation unit including said computer for processing signal values (WA, WB) of signals outputted by the sensors, and for calculating the desired rotational angle (α), the evaluating unit operating in accordance with procedural steps comprising:

setting the signal values (WA, WB) that are larger than the standardized maximum value or smaller than the standardized minimum value to be limited to the maximum or minimum values;

determining quadrant (I, II, III, IV) by a value of the measured signal value (WA, WB) in which the desired angle (α) is located;

depending on the sign of a respective curve slope, the sign of the signal value (WA, WB) is to be changed or retained;

adding adapted signal values thus obtained (WAV, WBV) to form a first sum (S); and determining an angle difference (β) between the middle of the determined quadrants (I, II, III, IV) and the desired angle (α) by the following equation $$\beta = \frac{S}{AD} \times 90°$$

where AD represents a value of the amplitude difference between the standardized maximum and minimum amplitudes.

10. Device according to claim 9, wherein said generator comprises a diametrically magnetized disk.

11. Device according to claim 9, wherein the sensors (SE) are Hall sensors.

12. Device according to claim 11, wherein the Hall sensors (SE) are self-adjusting.

13. Device according to claim 9, wherein the rotatable shaft is part of a rotatable switch.

14. Device according claim 10, further comprising a first coil and a second coil spaced apart from each other and located adjacent said diametrically magnetized disk for imparting a rotational torque to said disk upon electrical energization of said coils.

* * * * *